United States Patent
Sato et al.

(10) Patent No.: US 12,289,826 B2
(45) Date of Patent: Apr. 29, 2025

(54) MULTILAYER RESIN SUBSTRATE AND ELECTRONIC COMPONENT

(71) Applicant: Murata Manufacturing Co., Ltd., Nagaokakyo (JP)

(72) Inventors: Takako Sato, Nagaokakyo (JP); Hiroki Maegawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 639 days.

(21) Appl. No.: 17/506,923

(22) Filed: Oct. 21, 2021

(65) Prior Publication Data

US 2022/0046793 A1    Feb. 10, 2022

Related U.S. Application Data

(63) Continuation of application No. PCT/JP2020/018944, filed on May 12, 2020.

(30) Foreign Application Priority Data

May 15, 2019  (JP) ................. 2019-092473

(51) Int. Cl.
*H05K 1/02*       (2006.01)
*H05K 1/03*       (2006.01)
*H05K 1/14*       (2006.01)

(52) U.S. Cl.
CPC ......... *H05K 1/0298* (2013.01); *H05K 1/0225* (2013.01); *H05K 1/032* (2013.01);
(Continued)

(58) Field of Classification Search
CPC ...... H05K 1/0298; H05K 1/032; H05K 1/141; H05K 1/0225; H05K 3/368;
(Continued)

(56) References Cited

U.S. PATENT DOCUMENTS 5,479,138 A * 12/1995 Kuroda ............... H05K 1/0253
333/1
6,191,472 B1 * 2/2001 Mazumder .......... H01L 23/5383
257/691

(Continued)

FOREIGN PATENT DOCUMENTS

JP       57-88968 U      6/1982
JP       2000-165042 A   6/2000
(Continued)

OTHER PUBLICATIONS

English Translation JP200513634, Denso Corp; Kondo et al., Published May 26, 2005 (Year: 2005).*

(Continued)

*Primary Examiner* — Steven T Sawyer
(74) *Attorney, Agent, or Firm* — Keating & Bennett, LLP

(57) ABSTRACT

A multilayer resin substrate includes insulating resin base material layers, and conductor patterns on at least one of the insulating resin base material layers. The conductor patterns include a ground conductor on a main surface of the insulating resin base material layers and extend into a frame shape or a planar shape, and the ground conductor includes openings. An aperture ratio of the openings in an outer peripheral portion of the ground conductor is less than an aperture ratio of the openings in an inner peripheral portion of the ground conductor.

16 Claims, 11 Drawing Sheets

(52) U.S. Cl.
CPC ........... *H05K 1/141* (2013.01); *H05K 1/0271* (2013.01); *H05K 2201/068* (2013.01); *H05K 2201/09136* (2013.01); *H05K 2201/0969* (2013.01)

(58) Field of Classification Search
CPC ..... H05K 2201/0141; H05K 2201/068; H05K 1/0271; H05K 2201/09136; H05K 2201/0969; H05K 1/0253
See application file for complete search history.

(56) References Cited

U.S. PATENT DOCUMENTS

| | | | |
|---|---|---|---|
| 2002/0153611 A1* | 10/2002 | Nakanishi | H05K 1/0253 257/774 |
| 2003/0127249 A1* | 7/2003 | Budell | H05K 1/0224 174/262 |
| 2012/0326812 A1* | 12/2012 | Ohhira | H01P 3/006 333/238 |
| 2013/0127560 A1* | 5/2013 | Kato | H03H 7/38 333/12 |
| 2017/0012008 A1* | 1/2017 | Yasooka | H05K 1/00 |
| 2018/0090429 A1 | 3/2018 | Kobayashi et al. | |
| 2020/0303799 A1* | 9/2020 | Wang | H05K 1/0222 |

FOREIGN PATENT DOCUMENTS

| | | |
|---|---|---|
| JP | 2005-136347 A | 5/2005 |
| JP | 2005-353835 A | 12/2005 |
| JP | 2008-172151 A | 7/2008 |
| WO | 2017/006391 A1 | 1/2017 |

OTHER PUBLICATIONS

Official Communication issued in International Patent Application No. PCT/JP2020/018944, mailed on Aug. 18, 2020.

* cited by examiner

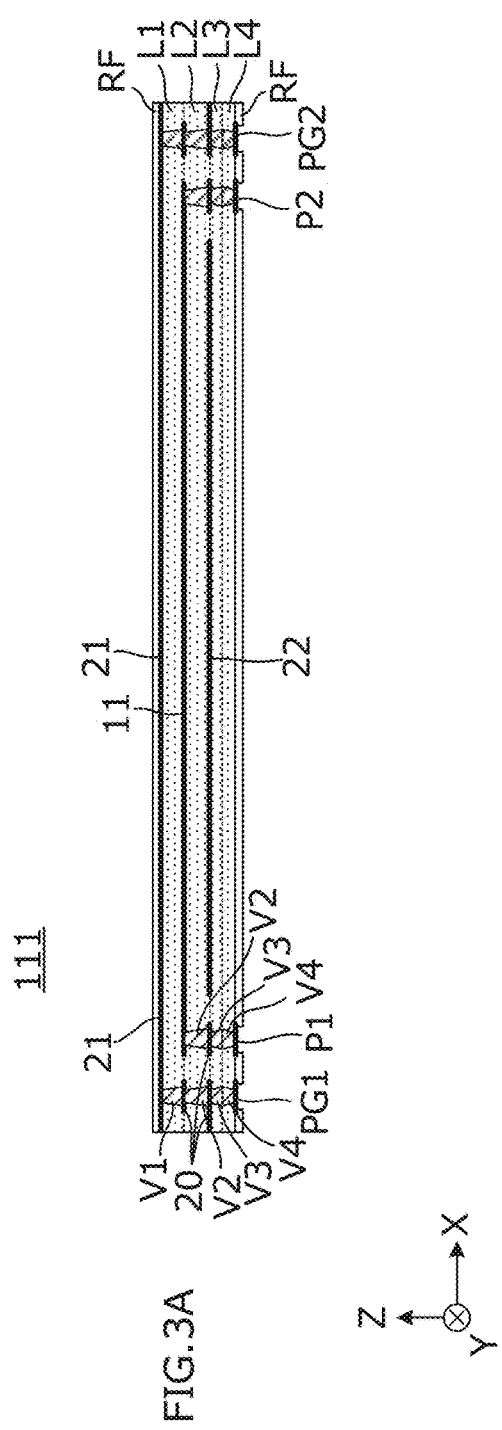
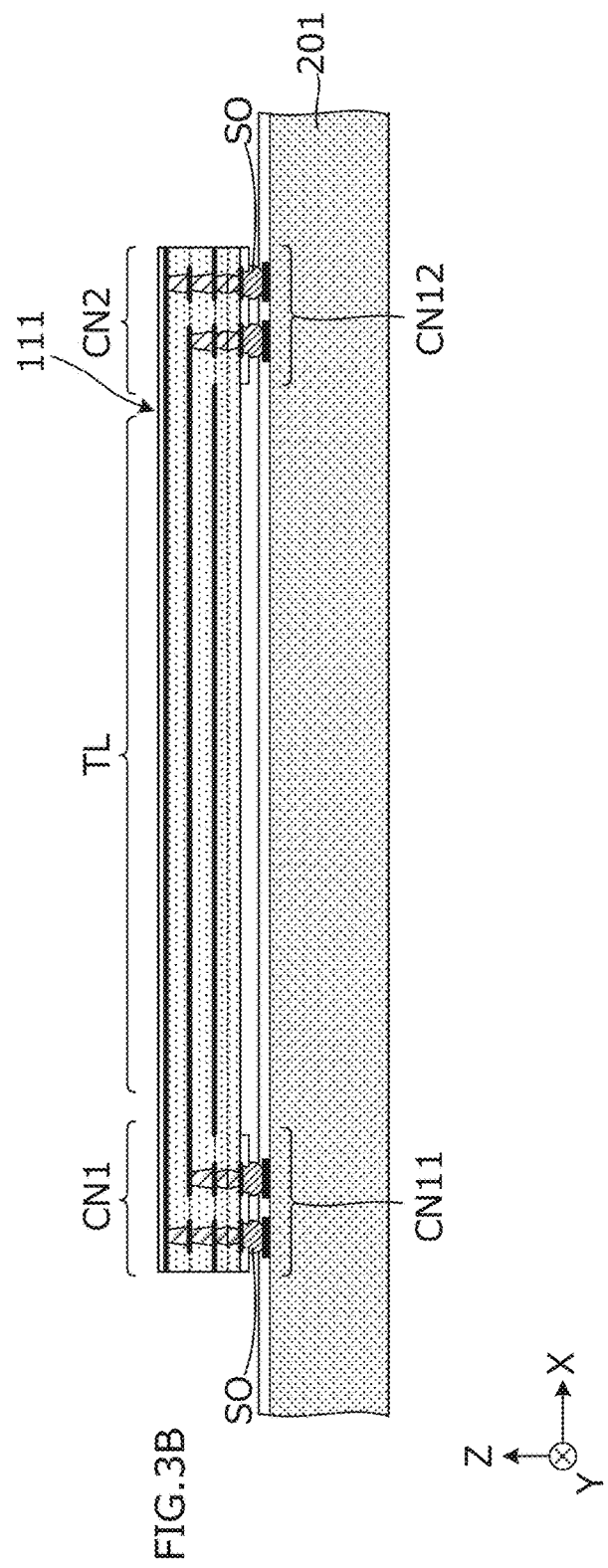

MULTILAYER RESIN SUBSTRATE AND ELECTRONIC COMPONENT

CROSS REFERENCE TO RELATED APPLICATIONS

This application claims the benefit of priority to Japanese Patent Application No. 2019-092473 filed on May 15, 2019 and is a Continuation Application of PCT Application No. PCT/JP2020/018944 filed on May 12, 2020. The entire contents of each application are hereby incorporated herein by reference.

BACKGROUND OF THE INVENTION

1. Field of the Invention

The present invention relates to a multilayer resin substrate that includes a plurality of insulating resin base material layers and a plurality of conductor patterns provided on the plurality of insulating resin base material layers, and an electronic component that includes a signal line and a ground conductor.

2. Description of the Related Art

Japanese Unexamined Patent Application Publication No. 2005-136347 discloses a multilayer substrate made of a thermoplastic resin, the multilayer substrate including a conductor pattern configured by a wiring portion as a circuit portion, a land electrically connected to the wiring portion, and a metal pattern electrically insulated from the wiring portion and the land, the metal pattern including very small gas vent holes penetrating in a stacking direction.

The gas vent holes discharge gas produced in the substrate during heating in a direction with a short discharge path. As a result, the amount of gas left in the multilayer substrate is reduced, and thus delamination or deformation caused during the heating is reduced.

In a multilayer resin substrate including a plurality of insulating resin base material layers on which a conductor pattern is provided that are stacked on each other, the conductor pattern and the insulating resin base material layers during the heating behave differently, which causes the multilayer substrate to be easily deformed. For example, in a case in which the conductor pattern is metal foil, such as copper foil, the conductor pattern expands and contracts according to a linear expansion coefficient, and then the insulating resin base material layers change compositional properties around the glass transition temperature, which results in expansion and contraction. As a result, the multilayer resin substrate is prone to deformation in the stacking direction, such as warping or twisting, or distortion in an in-plane direction, during heating.

In a structure of the multilayer resin substrate disclosed in Japanese Unexamined Patent Application Publication No. 2005-136347, when the gas vent holes are provided near an outer end or an end portion of the multilayer resin substrate and the multilayer resin substrate receives heat, stress applied to an interface between the conductor pattern and the insulating resin base material layer near the outer end or the end portion of the multilayer resin substrate may become uneven, which may cause the deformation or the distortion to become more significant.

SUMMARY OF THE INVENTION

Preferred embodiments of the present invention provide multilayer resin substrates and electronic components that are each able to significantly reduce or prevent deformation and distortion of the multilayer resin substrate due to expansion and contraction while significantly reducing or preventing delamination and deformation due to gas pressure produced in an insulating resin base material layer.

A multilayer resin substrate according to a preferred embodiment of the present disclosure includes a plurality of insulating resin base material layers, and a plurality of conductor patterns on at least one of the plurality of insulating resin base material layers, and the plurality of conductor patterns include a planar conductor on a main surface of the plurality of insulating resin base material layers and extending into a frame shape or a planar shape, the planar conductor includes a plurality of openings, and an aperture ratio of the plurality of openings in an outer peripheral portion of the planar conductor is less than an aperture ratio of the plurality of openings in an inner peripheral portion of the planar conductor.

A multilayer resin substrate according to a preferred embodiment of the present disclosure includes a plurality of insulating resin base material layers, and a plurality of conductor patterns on at least one of the plurality of insulating resin base material layers, and the plurality of conductor patterns include a planar conductor on a main surface of the plurality of insulating resin base material layers and extending into a frame shape or a planar shape, the planar conductor includes a plurality of openings, the plurality of openings include a first opening group in which a plurality of openings are arranged at regular intervals, and a second opening group in which a plurality of openings located closer to an outer end of the planar conductor than the first opening group are arranged at regular intervals, and a first opening group area being a total of plane cross-sectional areas of the first opening group is larger than a second opening group area being a total of plane cross-sectional areas of the second opening group.

A multilayer resin substrate according to a preferred embodiment of the present disclosure includes a plurality of insulating resin base material layers, and a plurality of conductor patterns on at least one of the plurality of insulating resin base material layers, the plurality of conductor patterns include a planar conductor on a main surface of the plurality of insulating resin base material layers and extending into a frame shape or a planar shape, and the planar conductor includes a plurality of openings, each of the plurality of openings, in a plan view, has a shape in which a width in a direction perpendicular or substantially perpendicular to a direction from an outer end of the planar conductor toward an inside is increased from the outer end of the planar conductor toward the inside, and the plurality of openings are arranged at regular intervals.

An electronic component according to a preferred embodiment of the present disclosure includes a plurality of insulating resin base material layers, and a plurality of conductor patterns on at least one of the plurality of insulating resin base material layers, and the plurality of conductor patterns include a signal line, and a ground conductor that overlaps the signal line, when viewed in a stacking direction of the plurality of insulating resin base material layers and extends into a planar shape, the ground conductor includes a plurality of openings, and an aperture ratio of the plurality of openings in an outside portion of the ground conductor is less than an aperture ratio of the plurality of openings in an inside portion of the ground conductor.

An inner peripheral portion and an outer peripheral portion are provided. In a case in which two types of opening groups arranged at regular intervals include a first opening group, and a second opening group closer to the outer end of the planar conductor than the first opening group, a region of the planar conductor surrounding the first opening group in a direction in which a plurality of openings in the first opening group are arranged is defined as the inner peripheral portion, and a region of the planar conductor surrounding the second opening group in a direction in which a plurality of openings in the second opening group are arranged is defined as the outer peripheral portion. The opening group near the outer end is an opening group with a small average distance between each opening of the opening group and the outer end. In addition, the inner peripheral portion does not include the second opening group. The outer peripheral portion does not include the first opening group.

An inside portion and an outside portion are provided. The outside portion and the inside portion, when viewed in the stacking direction, are regions located more outside than the signal line formation region that overlaps a signal line. The outside portion, when viewed in the stacking direction, is a region located more outside than the inside portion. The outside portion includes an outer end of the ground conductor.

Herein, the "aperture ratio" of the plurality of openings is a ratio of an opening area per unit area. Therefore, the openings have the following relationship, for example.

(1) A size (a plane cross-sectional area) of the openings arranged at regular intervals in the outer peripheral portion or the outside portion is smaller than a size of the openings arranged at regular intervals in the inner peripheral portion or the inside portion. Herein, an interval (an interval of the distance between adjacent openings in an array direction) of the openings disposed in the outer peripheral portion or the outside portion is equal or substantially equal to the interval of the openings disposed in the inner peripheral portion or the inside portion.

(2) A number of openings in the outer peripheral portion or the outside portion is smaller than a number of openings provided in the inner peripheral portion or the inside portion. This can also mean that a distribution density of the openings in the outer peripheral portion or the outside portion is less than a distribution density of the openings in the inner peripheral portion or the inside portion.

(3) A shape of the openings arranged at regular intervals is tapered in the outer peripheral portion or the outside portion, as compared with the inner peripheral portion or the inside portion. This can also mean that a width of the openings arranged at regular intervals in an arrangement direction is smaller in the outer peripheral portion or the outside portion, as compared with the inner peripheral portion or the inside portion. In other words, the openings arranged at regular intervals have a width in a direction in which the openings are arranged at regular intervals, the width increasing from the outer end toward the inside of the planar conductor.

According to preferred embodiments of the present invention, multilayer resin substrates and electronic components that are each able to significantly reduce or prevent delamination and deformation due to gas pressure produced in an insulating resin base material layer and significantly reduce or prevent deformation and distortion of the multilayer resin substrate due to expansion and contraction are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is an A-A cross-sectional view in FIG. 2, and FIG. 3B is a cross-sectional view showing a state in which the electronic component 111 is mounted on a circuit board 201.

DETAILED DESCRIPTION OF THE PREFERRED EMBODIMENTS

Figure 1:
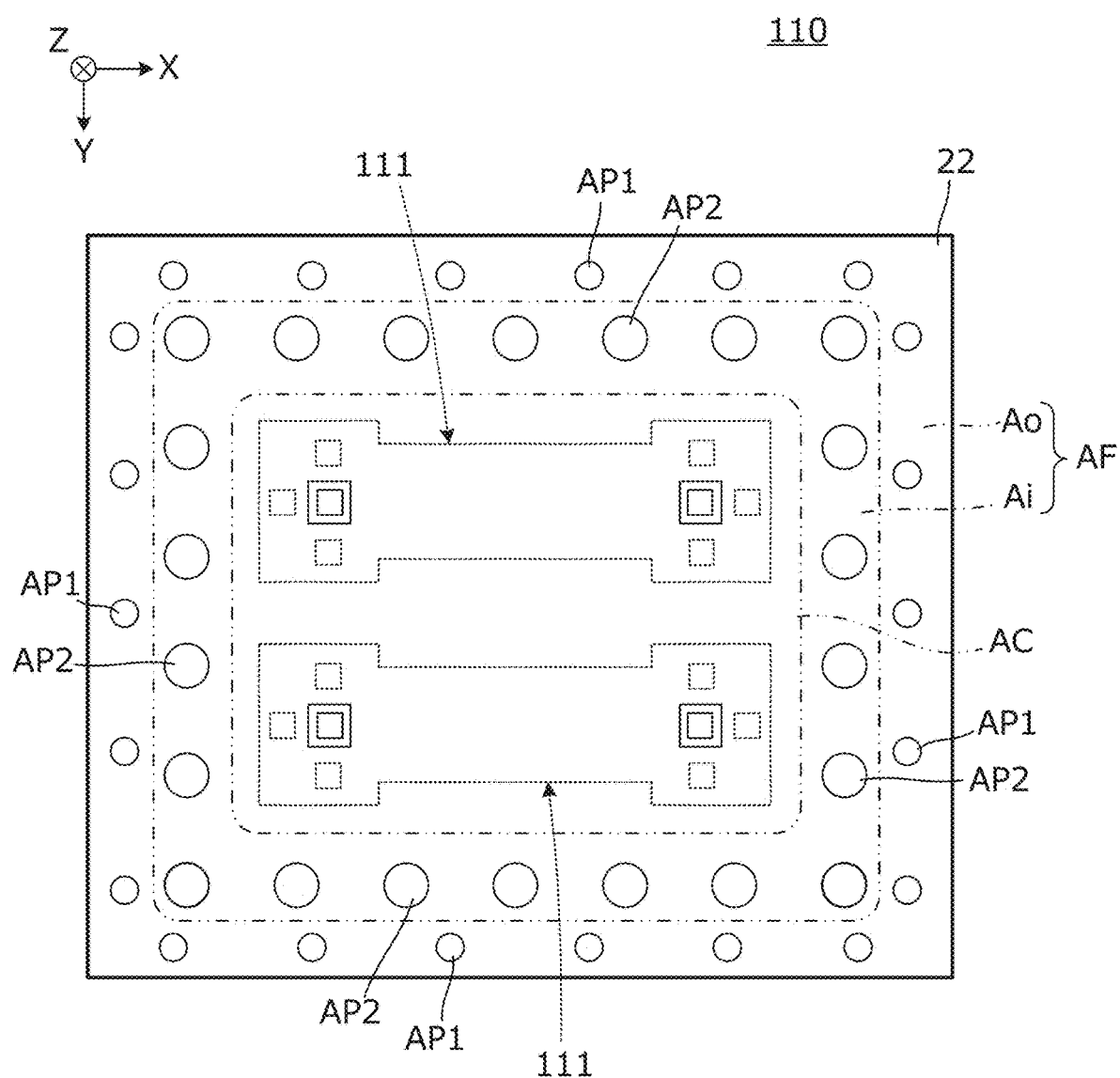
FIG. 1 is a plan view of a multilayer resin substrate 110 according to a first preferred embodiment of the present invention.

Hereinafter, preferred embodiments of the present invention will be described with reference to the attached drawings and several specific examples. In the drawings, components and elements assigned with the same reference numerals or symbols will represent the same or corresponding components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of matters common to the first preferred embodiment will be omitted and only different points will be described. In particular, the same or substantially the same advantageous functions and effects by the same or substantially the same configurations will not be described one by one for each preferred embodiment.

First Preferred Embodiment

Figure 2:
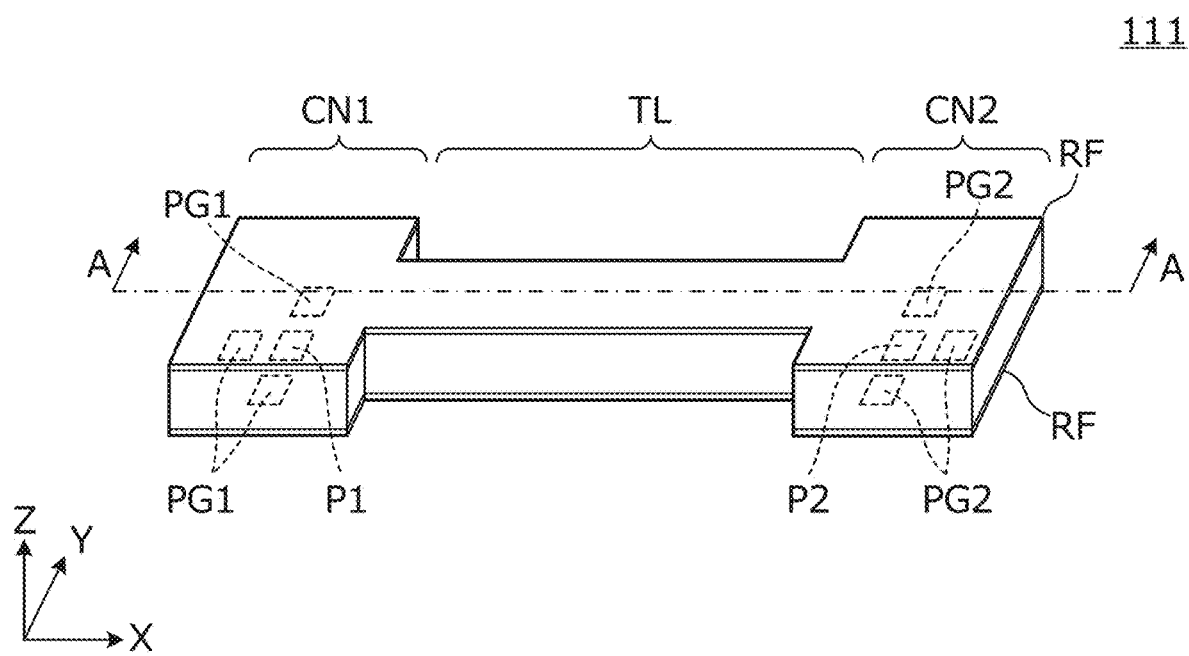
FIG. 2 is a perspective view of an electronic component 111 separated from the multilayer resin substrate 110.

FIG. 1 is a plan view of a multilayer resin substrate 110 according to a first preferred embodiment of the present invention. The multilayer resin substrate 110 is a collective substrate including an electronic component configuration region AC that defines a plurality of electronic components (two electronic components in this example) 111 and a frame region AF that supports the electronic component configuration region AC. Accordingly, the electronic component 111 corresponds to a "child board" when the collective substrate is referred to as a "parent board." FIG. 2 is a perspective view of the electronic component 111 separated from the multilayer resin substrate 110. Herein, the "electronic component" is a broad term that refers to an electronic component used not only for an active element or a passive element but for an electronic circuit device.

The multilayer resin substrate 110 includes a plurality of insulating resin base material layers, and a plurality of conductor patterns provided on at least one of the plurality of insulating resin base material layers. A ground conductor 22 is provided on the multilayer resin substrate 110. The ground conductor 22 corresponds to the "planar conductor extending in a planar shape".

The ground conductor 22 includes a plurality of openings for degassing. The plurality of openings include a first opening group in which a plurality of openings AP2 are arranged at regular intervals, and a second opening group in which a plurality of openings AP1 located closer to an outer end of a planar conductor than the first opening group are arranged at regular intervals. Of the plurality of openings, the openings AP1 are provided in an outer peripheral portion Ao of the ground conductor 22, and the openings AP2 are provided in an inner peripheral portion Ai of the ground conductor 22. In this example, an outer peripheral side of the frame region AF corresponds to the outer peripheral portion Ao, and an inner peripheral side corresponds to the inner peripheral portion Ai. Therefore, the inner peripheral portion Ai includes the first opening group and does not include the second opening group. The outer peripheral portion Ao includes the second opening group and does not include the first opening group.

The diameter of the openings AP1 is smaller than the diameter of the openings AP2. Then, an aperture ratio of the plurality of openings AP1 in the outer peripheral portion Ao is less than an aperture ratio of the plurality of openings AP2 in the inner peripheral portion Ai. Herein, the "aperture ratio," as described above, is a ratio of an opening area per unit area.

In addition, the number of openings AP2 is equal or substantially equal to the number of openings AP1. However, the size of an opening AP2 included in the first opening group is larger than the size of an opening AP1 included in the second opening group. As a result, a first opening group area being a total of plane cross-sectional areas of the first opening group is larger than a second opening group area being a total of plane cross-sectional areas of the second opening group. In addition, an interval of the openings AP2 in the first opening group is smaller than an interval of the openings AP1 in the second opening group.

In such a manner, the plurality of openings AP1 and AP2 are provided in the ground conductor 22 being a planar conductor extending in a planar shape, so that, during heating, gas to be produced from the inside of an insulating resin base material layer escapes from the openings AP1 and AP2 to the outside, which can prevent a failure such as delamination (interlayer peeling) or deformation (expansion and bubble protrusion) due to pressure of the gas. Further, the aperture ratio of the outer peripheral portion Ao of the ground conductor 22 is less than the aperture ratio of the inner peripheral portion Ai, so that the unevenness of stress applied to an interface between the ground conductor 22 and an insulating resin base material layer near the outer end or the end portion of the multilayer resin substrate 110 is significantly reduced or prevented. Therefore, deformation or distortion of the multilayer resin substrate 110 due to heating is small.

In FIG. 2, the electronic component 111 is a surface-mounted electronic component mounted on a circuit board, for example, as will be described later. The electronic component 111 includes a first connection portion CN1, a second connection portion CN2, and a transmission line portion TL. The first connection portion CN1, the transmission line portion TL, and the second connection portion CN2 are disposed in this order in a positive X direction. A signal electrode P1 and a ground electrode PG1 are exposed to a bottom surface of the first connection portion CN1 shown in FIG. 2, and a signal electrode P2 and a ground electrode PG2 are exposed to the second connection portion CN2. A transmission line that connects between the first connection portion CN1 and the second connection portion CN2 is provided in the transmission line portion TL.

FIG. 3A is an A-A cross-sectional view in FIG. 2, and FIG. 3B is a cross-sectional view showing a state in which the electronic component 111 is mounted on a circuit board 201.

The electronic component 111 includes four insulating resin base material layers L1, L2, L3, and L4, a resist film RF that covers both sides of a stacked body including the insulating resin base material layers L1, L2, L3, and L4, and a plurality of conductor patterns provided on the insulating resin base material layers L1, L2, L3, and L4. The conductor patterns include a signal line 11, and ground conductors 21 and 22 that overlap the signal line 11 when viewed in a stacking direction (a direction parallel or substantially parallel to a Z axis) of the insulating resin base material layers L1, L2, L3, and L4. The signal line 11, the ground conductors 21 and 22, and the insulating resin base material layers L1 and L2 between the signal line 11 and the ground conductors 21 and 22 define a stripline transmission line.

The insulating resin base material layers L1, L2, L3, and L4 are preferably thermoplastic resin base materials mainly including a liquid crystal polymer (LCP) or polyether ether ketone (PEEK), for example.

An interlayer connection conductor V1 that connects the ground conductor 21 and an interlayer connection conductor pattern 20 is provided on the insulating resin base material layer L1. In addition, an interlayer connection conductor V2 that is electrically connected to the interlayer connection conductor pattern 20 is provided on the insulating resin base material layer L2, an interlayer connection conductor V3 that is electrically connected to the interlayer connection conductor pattern 20 is provided on the insulating resin base material layer L3, and an interlayer connection conductor V4 that connects the ground electrodes PG1 and PG2 and the interlayer connection conductor V3, and an interlayer connection conductor V4 that connects the signal electrodes P1 and P2 and the interlayer connection conductor V3 are provided on the insulating resin base material layer L4. The interlayer connection conductors V1, V2, V3, and V4 are, for example, via conductors provided by disposing, in openings that define the interlayer connection conductor provided in the insulating resin base material layers, conductive paste preferably including metal powder of, for example, at least one metal of Cu and Sn or an alloy of Cu and Sn and a resin component, and then by solidifying the conductive paste through a heat press treatment in a lamination process.

The ground conductors 21 and 22 and the signal line 11 are provided by patterning Cu foil by photolithography, for example, the Cu foil being attached to the insulating resin base material layers.

As shown in FIG. 3B, a circuit-board-side first connection portion CN11 and a circuit-board-side second connection portion CN12 that are respectively connected to the first connection portion CN1 and the second connection portion CN2 of the electronic component 111 are provided on the circuit board 201.

The first connection portion CN1 of the electronic component 111 is connected to a pad electrode provided on the circuit-board-side first connection portion CN11 of the circuit board 201 via solder SO. Similarly, the second connection portion CN2 of the electronic component 111 is connected to a pad electrode provided on the circuit-board-side second connection portion CN12 of the circuit board 201 via solder SO. The solder SO is solder pre-coated before mounting, or a solder ball, for example.

Figure 4:
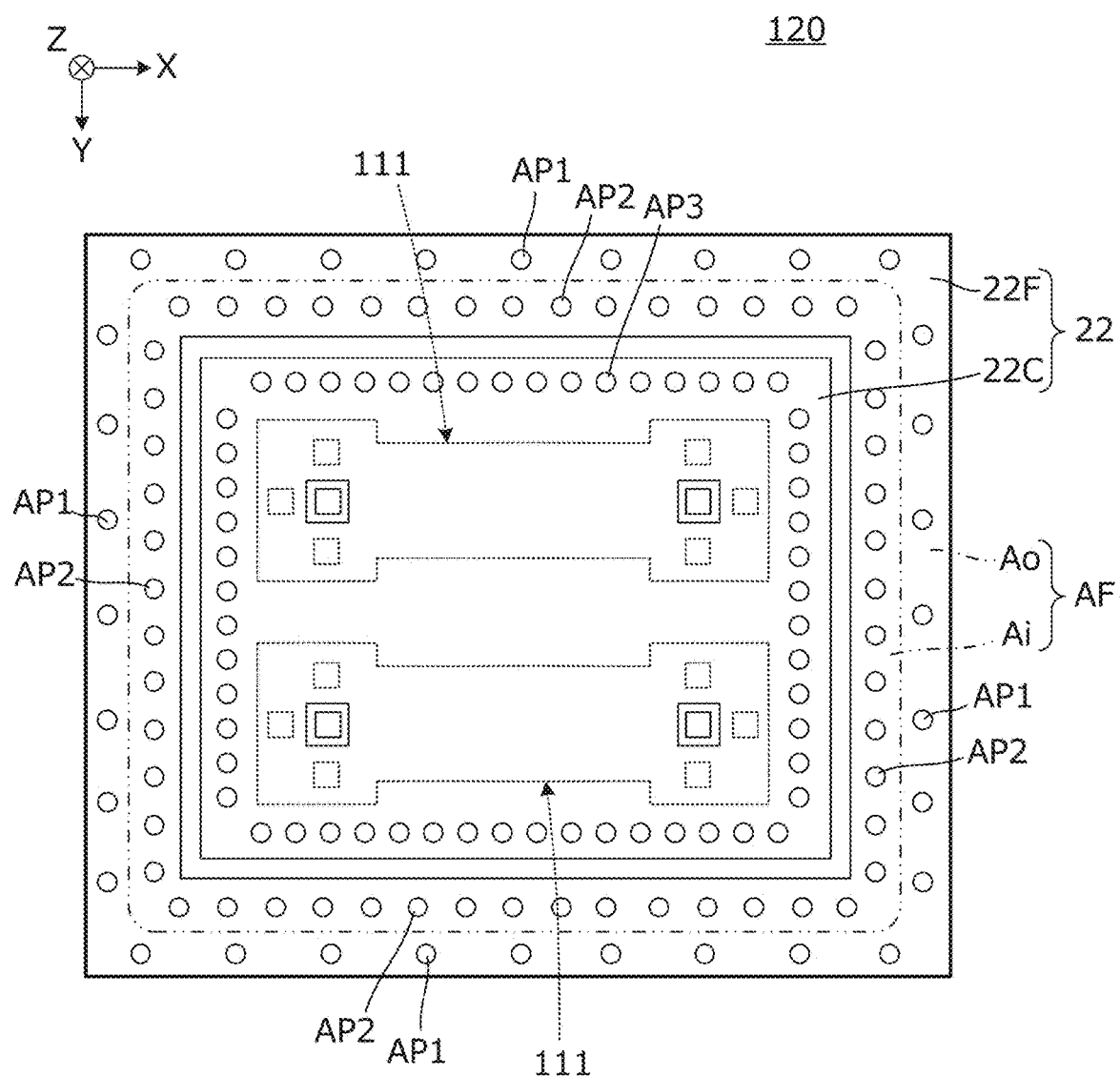
FIG. 4 is a plan view of a multilayer resin substrate 120 according to the first preferred embodiment of the present invention.

FIG. 4 is a plan view of another multilayer resin substrate 120 according to the first preferred embodiment of the present invention. The multilayer resin substrate 120 is different in the configuration of the openings AP1 and AP2 from the multilayer resin substrate 110 shown in FIG. 1. In addition, the multilayer resin substrate 120 has a different configuration of the ground conductor.

The multilayer resin substrate 120 includes a plurality of insulating resin base material layers, and a plurality of conductor patterns provided on the plurality of insulating resin base material layers. A ground conductor 22 is provided on the multilayer resin substrate 120. The ground conductor 22 includes frame-shaped ground conductors 22F along the outer periphery of the multilayer resin substrate 120 and internal ground conductors 22C.

A plurality of openings AP1 and AP2 for degassing are provided in the frame-shaped ground conductors 22F. Of the plurality of openings, the openings AP1 are provided in an outer peripheral portion Ao of the ground conductor 22, and the openings AP2 are provided in an inner peripheral portion Ai of the ground conductor 22. In addition, a plurality of openings AP3 are provided in the internal ground conductors 22C in this example.

Of the plurality of openings, the openings AP1 are provided in an outer peripheral portion Ao of the frame-shaped ground conductors 22F, and the openings AP2 are provided in an inner peripheral portion Ai of the frame-shaped ground conductors 22F. The diameter of each of the openings AP1 is equal or substantially equal to the diameter of each of the openings AP2. However, the number of openings AP2 in the first opening group is larger than the number of openings AP1 in the second opening group. Further, an interval of the openings AP2 in the first opening group is smaller than an interval of the openings AP1 in the second opening group. As a result, a first opening group area being a total of plane cross-sectional areas of the first opening group is larger than a second opening group area being the total of plane cross-sectional areas of the second opening group.

The plurality of openings include a first opening group in which a plurality of openings AP2 are arranged at regular intervals, and a second opening group in which a plurality of openings AP1 located closer to an outer end of the planar conductor than the first opening group are arranged at regular intervals. Furthermore, the first opening group area being the total of plane cross-sectional areas of the first opening group is larger than the second opening group area being the total of plane cross-sectional areas of the second opening group. As a result, during heating, gas to be produced from the inside of an insulating resin base material layer escapes from the openings AP1 and AP2 to the outside, which can prevent a failure, such as delamination (interlayer peeling) or deformation (expansion and bubble protrusion) due to pressure of the gas. Further, the second opening group area being the total of plane cross-sectional areas of the second opening group is smaller than the first opening group area being the total of plane cross-sectional areas of the first opening group, so that the unevenness of stress applied to an interface between the ground conductor 22 and an insulating resin base material layer near the outer end or the end portion of the multilayer resin substrate 110 is significantly reduced or prevented. Therefore, deformation or distortion of the multilayer resin substrate 110 due to heating is small.

The distribution density of the openings AP1 in the outer peripheral portion Ao is less than the distribution density of the openings AP2 in the inner peripheral portion Ai. In other words, an aperture ratio of the plurality of openings AP1 in the outer peripheral portion Ao is less than an aperture ratio of the plurality of openings AP2 in the inner peripheral portion Ai. The aperture ratio of the plurality of openings AP1 is preferably less than an aperture ratio of the plurality of openings AP3.

In such a manner, the plurality of openings AP1 and AP2 are provided in the frame-shaped ground conductor 22F being a planar conductor extending in a frame shape, so that, during heating, gas to be produced from the inside of an insulating resin base material layer escapes from the openings AP1 and AP2 to the outside, which reduces or prevents a failure such as delamination (interlayer peeling) or deformation (expansion and bubble protrusion) due to pressure of the gas. Further, the aperture ratio of the outer peripheral portion Ao of the ground conductor (or the frame-shaped ground conductor 22F) is less than the aperture ratio of the inner peripheral portion Ai, so that the unevenness of stress applied to an interface between the ground conductor 22 and an insulating resin base material layer near the outer end or the end portion of the multilayer resin substrate 120 is significantly reduced or prevented. Therefore, deformation or distortion of the multilayer resin substrate 120 due to heating is small.

Second Preferred Embodiment

A second preferred embodiment of the present invention provides an example of an electronic component including a multilayer resin substrate.

Figure 5:
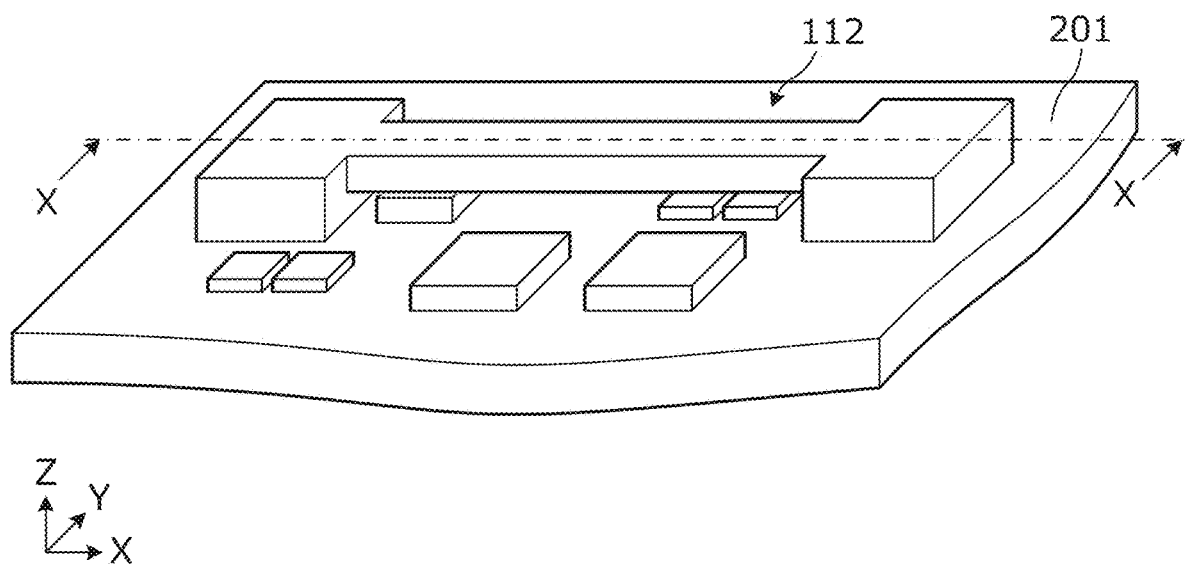
FIG. 5 is a perspective view showing a mounting structure of an electronic component 112 according to a second preferred embodiment of the present invention.
Figure 6:
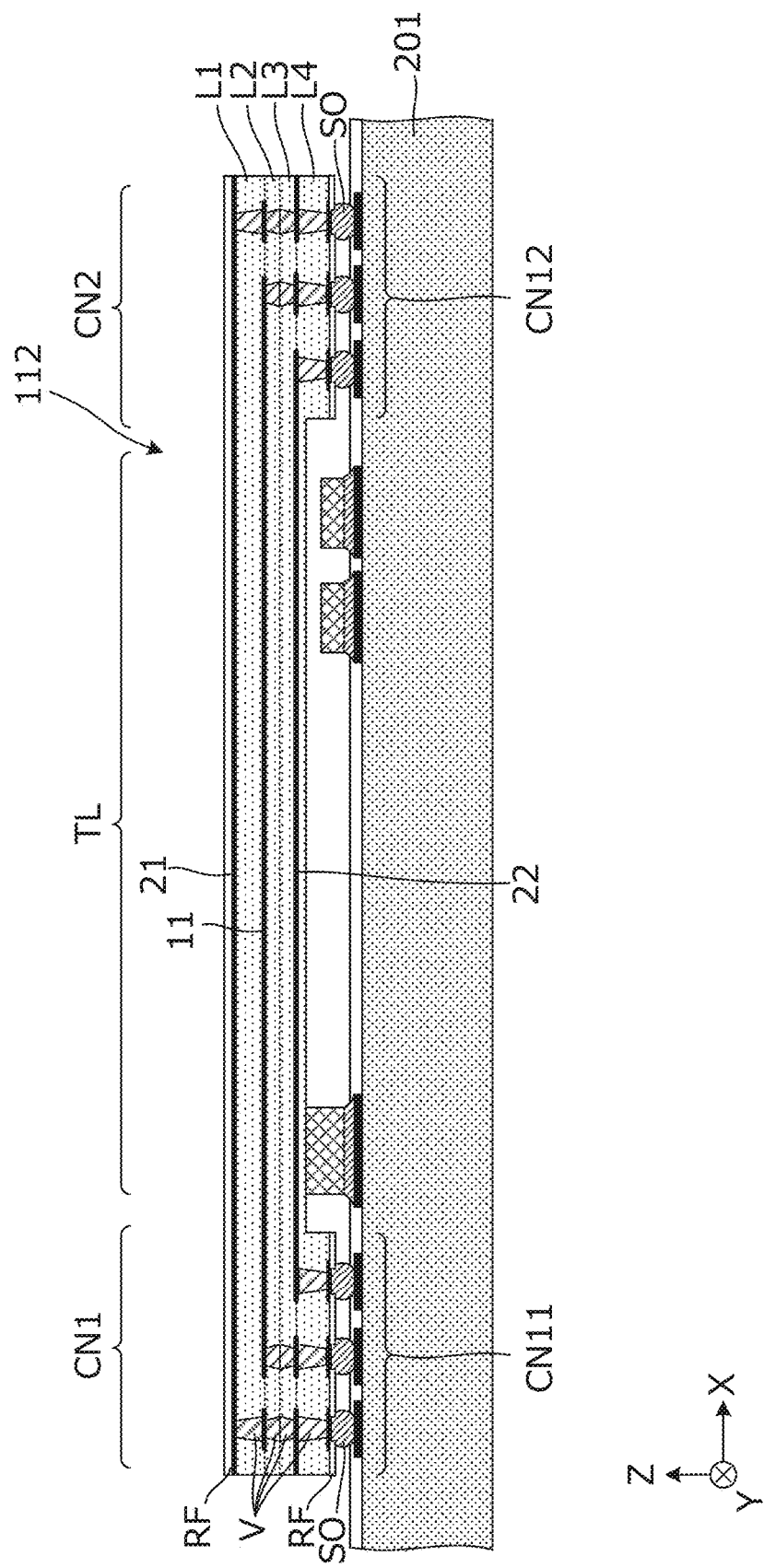
FIG. 6 is a vertical cross-sectional view along a line X-X in FIG. 5.

FIG. 5 is a perspective view showing a mounting structure of an electronic component 112 according to the second preferred embodiment of the present invention. FIG. 6 is a vertical cross-sectional view along a line X-X in FIG. 5. The electronic component 112 according to the present preferred embodiment is surface-mounted on the circuit board 201 and defines and functions as a signal transmission line.

As shown in FIG. 5 and FIG. 6, the electronic component 112 according to the present preferred embodiment includes a stacked body including a plurality of insulating resin base material layers, a transmission line portion TL provided on the stacked body, a first connection portion CN1 connected to a first portion of the transmission line portion TL, and a second connection portion CN2 connected to a second portion of the transmission line portion TL.

In the electronic component 112, when the X-axis direction in FIG. 5 and FIG. 6 is a longer direction, the first connection portion CN1 and the second connection portion CN2 are provided at both ends in the longer direction.

As shown in FIG. 6, a circuit-board-side first connection portion CN11 and a circuit-board-side second connection portion CN12 that are respectively connected to the first connection portion CN1 and the second connection portion CN2 of the electronic component 112 are provided on the circuit board 201. An interlayer connection conductor V is provided at a predetermined position in insulating resin base material layers L1 to L4.

As shown in FIG. 5, an electronic component is disposed between the transmission line portion TL of the electronic component 112, and the circuit board 201 while the electronic component 112 is provided on the circuit board 201.

The first connection portion CN1 of the electronic component 112 is connected to a pad electrode provided on the circuit-board-side first connection portion CN11 of the circuit board 201 via solder SO. Similarly, the second connection portion CN2 of the electronic component 112 is connected to a pad electrode provided on the circuit-board-side second connection portion CN12 of the circuit board 201 via solder SO. The solder SO is solder pre-coated before mounting, or a solder ball, for example.

Figure 7:
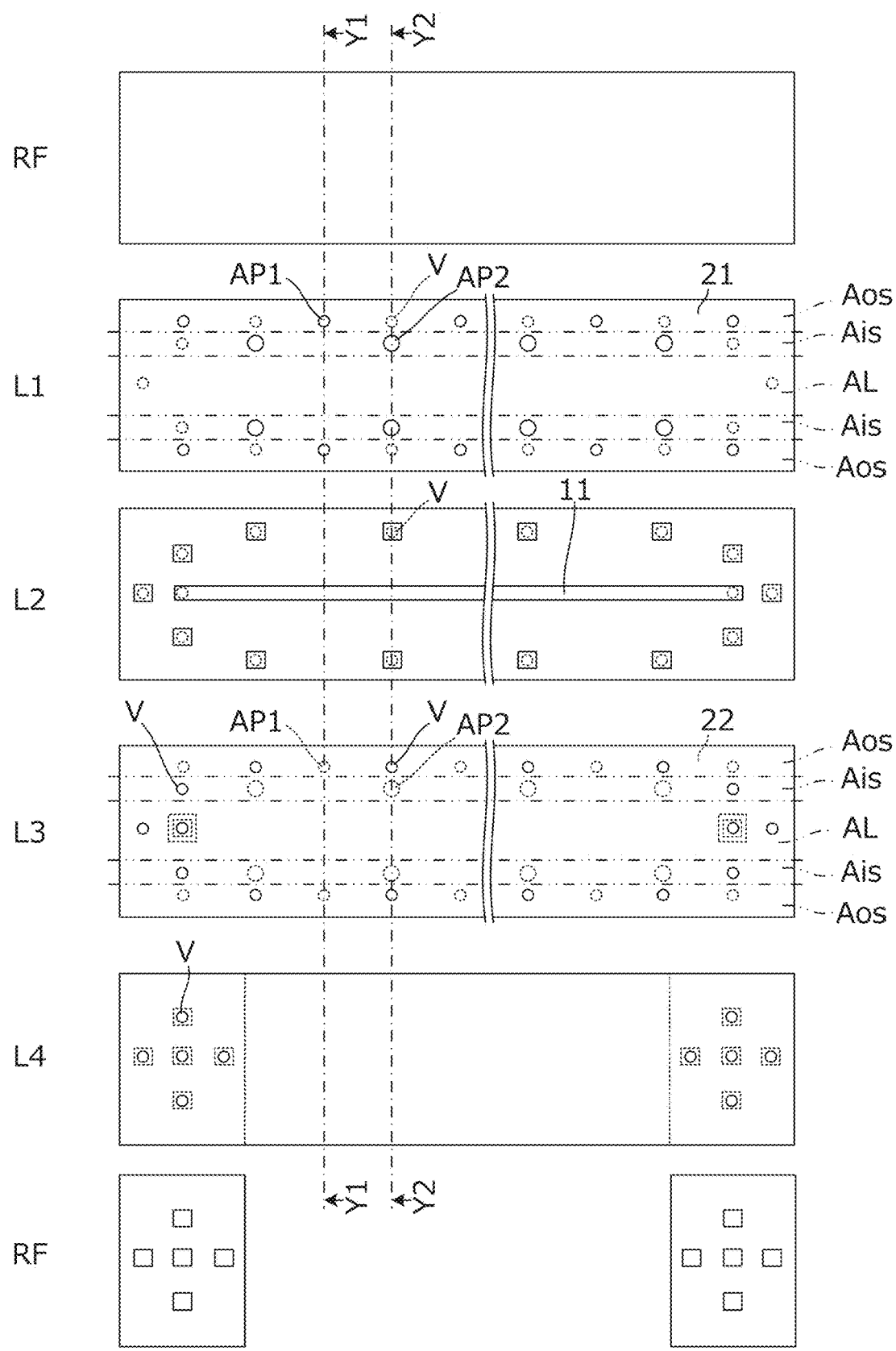
FIG. 7 is an exploded plan view of the electronic component 112.
Figure 8A:
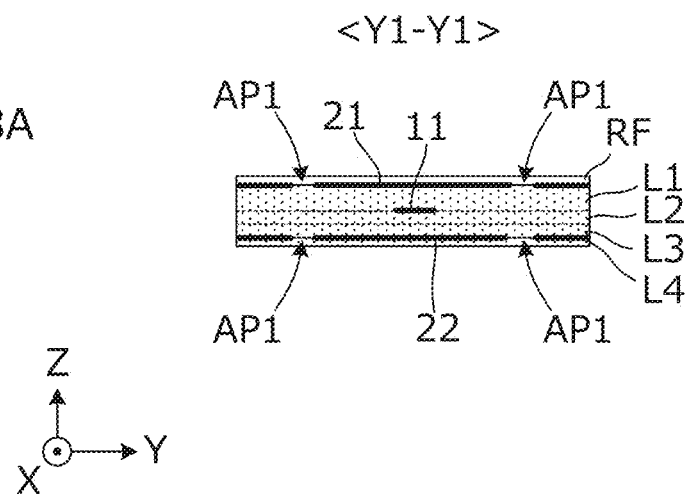
FIG. 8A is a vertical cross-sectional view along a line Y1-Y1 in FIG. 7.
Figure 8B:
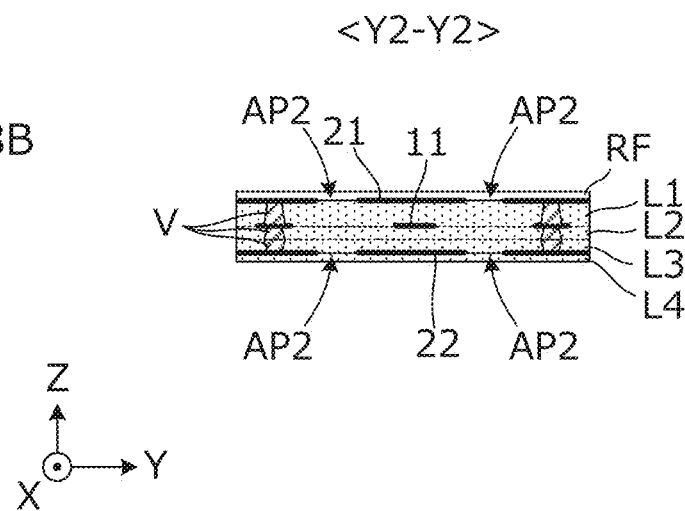
FIG. 8B is a vertical cross-sectional view along a line Y2-Y2 in FIG. 7.

FIG. 7 is an exploded plan view of the electronic component 112. FIG. 8A is a vertical cross-sectional view along a line Y1-Y1 in FIG. 7, and FIG. 8B is a vertical cross-sectional view along a line Y2-Y2 in FIG. 7. It is to be noted that FIG. 7, FIGS. 8A and 8B show an individual piece for convenience of explanation, but a normal manufacturing process is performed in a collective substrate state.

As shown in FIGS. 7, 8A, and 8B, the electronic component 112 includes the plurality of insulating resin base material layers L1 to L4 and the plurality of conductor patterns provided on the insulating resin base material layers L1 to L4. The plurality of conductor patterns include a signal line 11, and planar-shaped ground conductors 21 and 22 that overlap the signal line 11 when viewed in a stacking direction (a direction parallel to the Z axis) of the insulating resin base material layers L1 to L4. The signal line 11, the ground conductors 21 and 22, and the insulating resin base material layers L1, L2, and L3 between the signal line 11 and the ground conductors 21 and 22 define a stripline transmission line. The entire or substantially the entire top surface of the stacked body including the plurality of insulating resin base material layers L1 to L4 and the bottom surface of the first connection portion CN1 and the second connection portion CN2 are covered with a resist film RF.

The ground conductors 21 and 22 are able to be divided into an outside portion Aos, an inside portion Ais, and a signal line formation region AL. Herein, the signal line formation region AL, when viewed in the stacking direction, is a region including a portion overlapping the signal line 11, and the outside portion Aos and the inside portion Ais are regions more outside than the signal line formation region AL. The outside portion Aos is a region farther outside than the inside portion Ais. The outside portion Aos includes an outer end of the ground conductors 21 and 22.

The ground conductors 21 and 22 include a plurality of openings. The plurality of openings include a first opening group in which a plurality of openings AP2 are arranged at regular intervals, and a second opening group in which a plurality of openings AP1 located closer to an outer end of a planar conductor than the first opening group are arranged at regular intervals. The plurality of openings AP1 for degassing are provided in the outside portion Aos of the ground conductors 21 and 22, and the plurality of openings AP2 for degassing are provided in the inside portion Ais. Therefore, the inside portion Ais includes the first opening group and does not include the second opening group. The outside portion Aos includes the second opening group and does not include the first opening group. The diameter of the openings AP1 is smaller than the diameter of the openings AP2. Then, an aperture ratio of the plurality of openings AP1 in the outside portion Aos of the ground conductors 21 and 22 is less than an aperture ratio of the plurality of openings AP2 in the inside portion Ais of the ground conductors 21 and 22.

In addition, the number of openings AP2 is equal or substantially equal to the number of openings AP1. However, the size of an opening AP2 included in the first opening group is larger than the size of an opening AP1 included in the second opening group. As a result, a first opening group area being a total of plane cross-sectional areas of the first opening group is larger than a second opening group area being the total of plane cross-sectional areas of the second opening group.

In such a manner, the plurality of openings AP1 and AP2 are provided in the ground conductors 21 and 22 being planar conductors extending in a planar shape, so that, during heating in a process such as reflow soldering, for example, gas to be produced from the inside of an insulating resin base material layer escapes from the openings AP1 and AP2 to the outside, which reduces or prevents a failure such as delamination (interlayer peeling) or deformation (expansion and bubble protrusion) due to pressure of the gas. Further, the aperture ratio of the outside portion Aos of the ground conductors 21 and 22 is less than the aperture ratio of the inside portion Ais, so that the unevenness of stress applied to an interface between the ground conductors 21 and 22 and the insulating resin base material layers L1 and L3 near the outer end or the end portion of the electronic component 112 is significantly reduced or prevented. Therefore, deformation or distortion due to heating during mounting of the electronic components 112 on the circuit board 201 is small.

Therefore, the electronic component 112 according to the present preferred embodiment has little deformation of the outer shape or the outer surface due to interlayer peeling, and ensures flatness, so that even such an elongated electronic component 112 is able to be surface-mounted.

Figure 9:
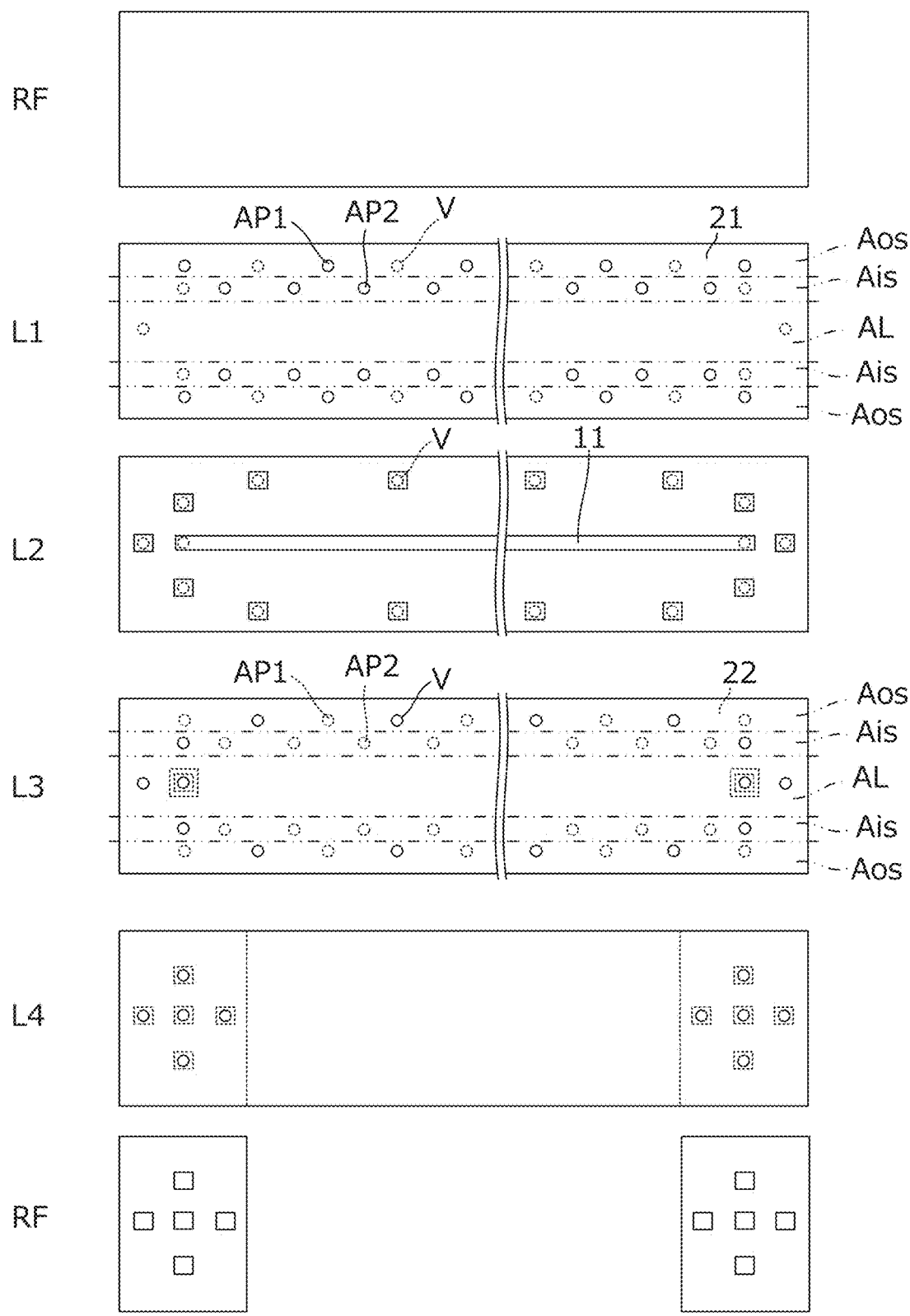
FIG. 9 is an exploded plan view of the electronic component according to the second preferred embodiment of the present invention.

FIG. 9 is an exploded plan view of another electronic component according to the second preferred embodiment of the present invention. The electronic component is different in the configuration of the openings AP1 and AP2 from the electronic component shown in FIG. 7.

As shown in FIG. 9, a plurality of openings AP1 and AP2 for degassing are provided in the outside portion Aos of the ground conductors 21 and 22. The diameter of each of the openings AP1 is equal or substantially equal to the diameter of each of the openings AP2. However, the number of openings AP2 in the first opening group is larger than the number of openings AP1 in the second opening group. Further, an interval of the openings AP2 in the first opening group is smaller than an interval of the openings AP1 in the second opening group. As a result, a first opening group area being a total of plane cross-sectional areas of the first opening group is larger than a second opening group area being the total of plane cross-sectional areas of the second opening group.

The distribution density of the openings AP1 in the outside portion Aos is less than the distribution density of the openings AP2 in the inside portion Ais. In other words, an aperture ratio of the plurality of openings AP1 in the outside portion Aos is less than an aperture ratio of the plurality of openings AP2 in the inside portion Ais.

Even with such a configuration of the openings AP1 and AP2, the unevenness of stress applied to an interface between the ground conductors 21 and 22 and the insulating resin base material layers L1 and L3 near the outer end or the end portion of the electronic component is significantly reduced or prevented. Therefore, deformation or distortion due to heating during mounting of an electronic components on the circuit board 201 is small.

Third Preferred Embodiment

A third preferred embodiment of the present invention shows a configuration of an opening for degassing being different from the opening in the examples described above.

Figure 10:
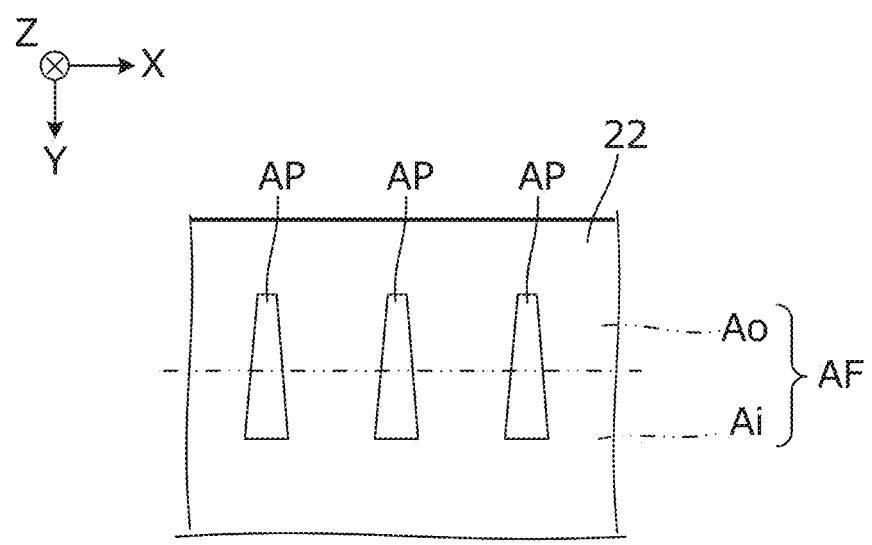
FIG. 10 is a partial plan view of a multilayer resin substrate according to a third preferred embodiment of the present invention.

FIG. 10 is a partial plan view of a multilayer resin substrate according to the third preferred embodiment of the present invention. While, in the example shown in FIG. 1, the plurality of openings AP1 for degassing are provided in the outer peripheral portion Ao of the ground conductor 22, and the plurality of openings AP2 for degassing are provided in the inner peripheral portion Ai, in the third preferred embodiment, a plurality of openings AP are provided continuously from the outer peripheral portion Ao to the inner peripheral portion Ai. Other configurations are the same or substantially the same as the configurations of the multilayer resin substrate 110 described in the first preferred embodiment.

In the present example, the openings AP have a trapezoidal shape tapering in the outer peripheral portion Ao compared with the inner peripheral portion Ai. In other words, each of the plurality of openings AP, when viewed in a stacking direction, has a shape in which a width in a direction perpendicular or substantially perpendicular to a direction from an outer end of the ground conductor 22 toward inside is increased from the outer end of the ground conductor 22 toward the inside. The plurality of openings AP are arranged at regular intervals. Accordingly, the aperture ratio of the openings in the outer peripheral portion Ao is less than the aperture ratio of the openings in the inner peripheral portion Ai.

As shown in the present preferred embodiment, the plurality of openings are not limited to a configuration in which the openings are individually separated and disposed in the outer peripheral portion Ao and the inner peripheral portion Ai, and some or all of the plurality of openings may be continuously disposed from the outer peripheral portion Ao to the inner peripheral portion Ai. While the openings AP have a tapering trapezoidal shape in the example shown in FIG. 10, the openings AP may have a shape in which a width in a direction (a direction parallel to the X-axis in FIG. 10) in which the openings are arranged at regular intervals changes stepwise.

In addition, although the multilayer resin substrate is illustrated herein, preferred embodiments of the present invention are also applicable to an electronic component. For example, in FIG. 7, the plurality of continuous openings AP may be provided from the outside portion Aos to the inside portion Ais.

Fourth Preferred Embodiment

A fourth preferred embodiment of the present invention shows a configuration of an opening for degassing that is different from the opening in the examples described above.

Figure 11:
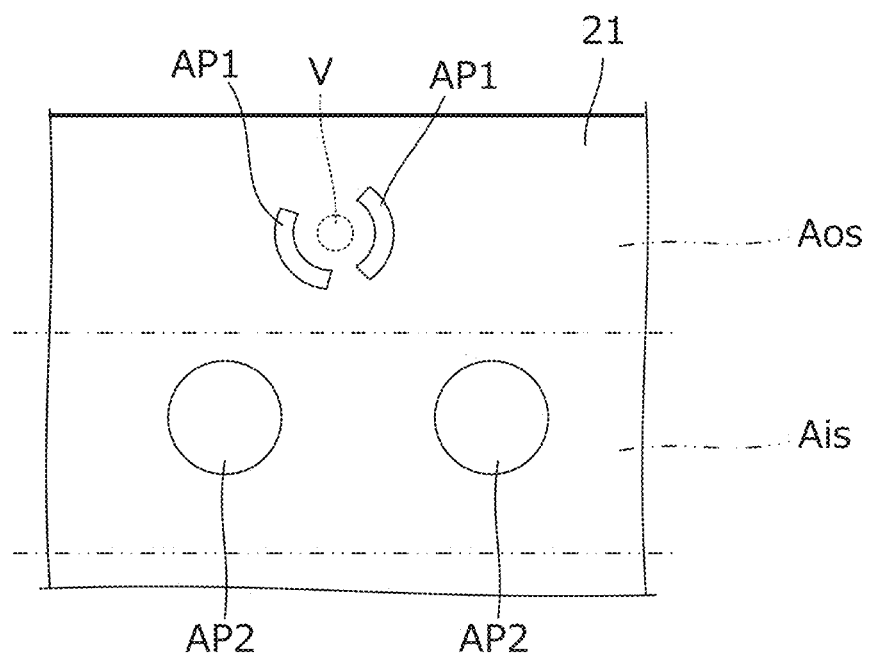
FIG. 11 is a partial plan view of an electronic component according to a fourth preferred embodiment of the present invention.

FIG. 11 is a partial plan view of an electronic component according to the fourth preferred embodiment of the present invention. While, in the example shown in FIG. 7, the plurality of openings AP1 for degassing and the plurality of interlayer connection conductors (via conductors) V are independently provided in the outside portion Aos of the ground conductors 21 and 22, in the fourth preferred embodiment, a plurality of openings AP1 are provided around an interlayer connection conductor V (so as not to overlap the interlayer connection conductor V and to partially surround the interlayer connection conductor V). Other configurations are the same or substantially the same as the configurations of the electronic component 112 described in the second preferred embodiment.

In the present preferred embodiment, an aperture ratio of the plurality of openings AP1 in the outside portion Aos is less than an aperture ratio of the plurality of openings AP2 in the inside portion Ais.

As shown in the present preferred embodiment, the openings AP1 are provided so as to surround the interlayer connection conductor V, that is, the openings AP1 are in proximity to the interlayer connection conductor V, so that gas to be produced from the interlayer connection conductor V effectively escapes from the openings AP1. In addition, since the openings AP1 do not overlap the interlayer connection conductor V, conductive paste does not leak from the openings AP1 when the interlayer connection conductor V is heated and pressed.

A group of the interlayer connection conductor V and the openings AP1 is not limited to being provided in the outside portion Aos, and a group of the interlayer connection conductor V and the openings AP2 may be provided in the inside portion Ais. In addition, a group of the interlayer connection conductor V and the openings is not limited to being provided in the outside portion Aos or the inside portion Ais in the electronic component and may also be provided in the outer peripheral portion Ao or in the inner peripheral portion Ai in the multilayer resin substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer resin substrate comprising:
a plurality of insulating resin base material layers; and
a plurality of conductor patterns on at least one of the plurality of insulating resin base material layers; wherein
the plurality of conductor patterns include a planar conductor on a main surface of the plurality of insulating resin base material layers and extending into a frame shape or a planar shape;
the planar conductor includes a plurality of openings;
an aperture ratio of the plurality of openings in an outer peripheral portion of the planar conductor is less than an aperture ratio of the plurality of openings in an inner peripheral portion of the planar conductor;
the outer peripheral portion contacts an outer end of the planar conductor, when viewed in a stacking direction;
the inner peripheral portion contacts an inner end of the planar conductor, when viewed in the stacking direction, wherein the plurality of conductor patterns include the planar conductor extending into the frame shape and/or the inner peripheral portion contacts an electronic component configuration region in which an electronic component is provided, when viewed in the stacking direction, where the plurality of conductor patterns include the planar conductor extending into the planar shape;
the electronic component configuration region entirely or substantially entirely overlaps the planar conductor and is surrounded by the inner peripheral portion, when viewed in the stacking direction;

the outer peripheral portion and the inner peripheral portion are in contact with each other; and the electronic component and the plurality of openings are both provided at a same surface of the multilayer resin substrate.

2. The multilayer resin substrate according to claim 1, wherein the plurality of openings include:
a first opening group in which a plurality of openings are arranged at regular intervals; and
a second opening group in which a plurality of openings located closer to the outer end of the planar conductor than the first opening group are arranged at regular intervals;
a first opening group area being a total of plane cross-sectional areas of the first opening group is larger than a second opening group area being a total of plane cross-sectional areas of the second opening group;
the inner peripheral portion includes the first opening group and does not include the second opening group; and
the outer peripheral portion includes the second opening group and does not include the first opening group.

3. The multilayer resin substrate according to claim 2, wherein a number of openings in the first opening group is larger than a number of openings in the second opening group.

4. The multilayer resin substrate according to claim 2, wherein a size of an opening included in the first opening group is larger than a size of an opening included in the second opening group.

5. The multilayer resin substrate according to claim 2, wherein an interval of the openings in the first opening group is smaller than an interval of the openings in the second opening group.

6. The multilayer resin substrate according to claim 1, wherein each of the plurality of openings, when viewed in the stacking direction, has a shape in which a width in a direction perpendicular or substantially perpendicular to a direction from the outer end of the planar conductor toward inside is increased from the outer end of the planar conductor toward the inside; and
the plurality of openings are arranged at regular intervals.

7. The multilayer resin substrate according to claim 1, further comprising:
the electronic component configuration region in which the electronic component is provided; and
a frame region that supports the electronic component configuration region until the electronic component is separated from the electronic component configuration region; wherein
the plurality of openings are disposed in the frame region.

8. A multilayer resin substrate comprising:
a plurality of insulating resin base material layers; and
a plurality of conductor patterns on at least one of the plurality of insulating resin base material layers; wherein
the plurality of conductor patterns include a planar conductor on a main surface of the plurality of insulating resin base material layers and extending into a frame shape or a planar shape;
the planar conductor includes a plurality of openings;
the plurality of openings include:
a first opening group in which a plurality of openings are arranged at regular intervals; and
a second opening group in which a plurality of openings located closer to an outer end of the planar conductor than the first opening group are arranged at regular intervals;
a first opening group area being a total of plane cross-sectional areas of the first opening group is larger than a second opening group area being a total of plane cross-sectional areas of the second opening group;
an outer peripheral portion includes the second opening group;
an inner peripheral portion includes the first opening group;
the outer peripheral portion contacts the outer end of the planar conductor, when viewed in a stacking direction;
the inner peripheral portion contacts an inner end of the planar conductor, when viewed in the stacking direction, where the plurality of conductor patterns include the planar conductor extending into a frame shape, or contacts an electronic component configuration region in which an electronic component is provided, when viewed in the stacking direction, in a case in which the plurality of conductor patterns include the planar conductor extending into the planar shape;
the electronic component configuration region entirely or substantially entirely overlaps the planar conductor and is surrounded by the inner peripheral portion, when viewed in the stacking direction;
the outer peripheral portion and the inner peripheral portion are in contact with each other; and
the electronic component and the plurality of openings are both provided at a same surface of the multilayer resin substrate.

9. The multilayer resin substrate according to claim 8, further comprising:
the electronic component configuration region in which the electronic component is provided; and
a frame region that supports the electronic component configuration region until the electronic component is separated from the electronic component configuration region; wherein
the plurality of openings are disposed in the frame region.

10. An electronic component comprising:
a plurality of insulating resin base material layers;
a plurality of conductor patterns on at least one of the plurality of insulating resin base material layers;
a first connection portion and a second connection portion connected to an external circuit; and
a transmission line portion connecting the first connection portion and the second connection portion; wherein
the plurality of conductor patterns include:
a signal line; and
a ground conductor that overlaps the signal line, when viewed in a stacking direction of the plurality of insulating resin base material layers and extends into a planar shape;
the ground conductor includes a plurality of openings;
an aperture ratio of the plurality of openings in an outside portion of the ground conductor is less than an aperture ratio of the plurality of openings in an inside portion of the ground conductor;
the first connection portion and the second connection portion include the ground conductor that includes the plurality of openings; and
the transmission line is surrounded by the inside portion, when viewed in the stacking direction.

11. The electronic component according to claim 10 wherein the plurality of openings include:
- a first opening group in which a plurality of openings are arranged at regular intervals; and
- a second opening group in which a plurality of openings located closer to an outer end of the ground conductor than the first opening group are arranged at regular intervals;

a first opening group area being a total of plane cross-sectional areas of the first opening group is larger than a second opening group area being a total of plane cross-sectional areas of the second opening group;

the inside portion includes the first opening group and does not include the second opening group; and the outside portion includes the second opening group and does not include the first opening group.

12. The electronic component according to claim 11, wherein a number of openings in the first opening group is larger than a number of openings in the second opening group.

13. The electronic component according to claim 11, wherein a size of an opening included in the first opening group is larger than a size of an opening included in the second opening group.

14. The electronic component according to claim 11, wherein an interval of the openings in the first opening group is smaller than an interval of the openings in the second opening group.

15. The electronic component according to claim 10, wherein
- each of the plurality of openings, in a plan view, has a shape in which a width in a direction perpendicular or substantially perpendicular to a direction from an outer end of the ground conductor toward inside is increased from the outer end of the ground conductor toward the inside; and
- the plurality of openings are arranged at regular intervals.

16. The electronic component according to claim 10, wherein
- the outside portion contacts an outer end of the ground conductor, when viewed in the stacking direction;
- the inside portion contacts a signal line formation region including a portion that overlaps the signal line, when viewed in the stacking direction;
- the signal line formation region entirely or substantially entirely overlaps the ground conductor, when viewed in the stacking direction; and
- the outside portion and the inside portion are in contact with each other.

* * * * *